United States Patent [19]

Shepela

[11] Patent Number: 5,094,980
[45] Date of Patent: Mar. 10, 1992

[54] METHOD FOR PROVIDING A METAL-SEMICONDUCTOR CONTACT

[75] Inventor: Adam Shepela, Bolton, Mass.

[73] Assignee: Digital Equipment Corporation, Maynard, Mass.

[21] Appl. No.: 412,634

[22] Filed: Sep. 25, 1989

Related U.S. Application Data

[63] Continuation of Ser. No. 160,328, Feb. 25, 1988, abandoned, which is a continuation-in-part of Ser. No. 879,359, Jun. 27, 1986, abandoned.

[51] Int. Cl.$^5$ ............................................ H01L 21/44
[52] U.S. Cl. ...................................... 437/189; 437/200; 437/190; 437/192; 437/944; 148/DIG. 100
[58] Field of Search ............... 437/200, 189, 190, 192, 437/944; 156/644, 653; 148/DIG. 100

[56] References Cited

U.S. PATENT DOCUMENTS

| | | | |
|---|---|---|---|
| 4,392,150 | 7/1983 | Courreges | 437/200 |
| 4,443,930 | 4/1984 | Hwang et al. | 437/200 |
| 4,551,908 | 11/1985 | Nagasawa et al. | 437/200 |
| 4,558,507 | 12/1985 | Okabayashi et al. | 437/200 |
| 4,575,920 | 3/1986 | Tsunashima | 437/192 |
| 4,657,628 | 4/1987 | Holloway et al. | 437/200 |
| 4,822,754 | 4/1989 | Lynch et al. | 437/200 |
| 4,851,895 | 7/1989 | Green et al. | 357/67 |
| 4,894,693 | 1/1990 | Tigelaar et al. | 357/67 |

*Primary Examiner*—Brian E. Hearn
*Assistant Examiner*—Tuan Nguyen
*Attorney, Agent, or Firm*—Arnold, White & Durkee

[57] ABSTRACT

By means of conventional deposition and lift-off processes, a metal contact plate is simultaneouslsy placed over transistor junction surfaces and over the surrounding field oxide boundary. After this process step, a dielectric layer, insulating the metal interconnect from the gate interconnect, is deposited and contact openings are plasma etched down to the metal contact plate, which acts to prevent erosion of the junction surface and the field oxide layer. When a diffusion barrier metal is used, the thermal stability of the contact resistance and the electromigration susceptibility are improved. While maintaining minimum transistor design dimensions and required alignment tolerances, the contacting metal plate allows for an increase in the contact opening area.

15 Claims, 4 Drawing Sheets

METHOD FOR PROVIDING A METAL-SEMICONDUCTOR CONTACT

This is a continuation of copending application Ser. No. 07/160,328 filed on Feb. 25, 1988, which was a continuation-in-part of copending application Ser. No. 06/879,359 filed on Jun. 27, 1986, both abandoned.

BACKGROUND OF THE INVENTION

1. Field of the Invention

This invention relates generally to the manufacture of integrated circuits using silicon technology, more particularly, to the vertical layering and layout design of metal contacts on the surface of a silicon junction.

As the design dimensions of MOS (Metal Oxide Semiconductors) transistors have been decreased to improve performance, conventional layout rules require smaller metal contact areas, smaller alignment tolerances of the metal to the junction area and more precise photoresist masking tolerances. The typical implementation of the self-aligned silicide processes for gate interconnect and transistor junction (source/drain) surfaces presents a plasma etch control problem. The self-aligned silicide process, commonly referred to as the salicide process, includes the deposition of a metal over the silicon surfaces of the transistor source and drain regions and over the poly-crystalline silicon surface of the gate interconnect regions. The metal layer then reacts with the silicon and poly-crystalline silicon surface at an elevated temperature (400° C. to 800° C.) to form a metal silicide, such as $CoSi_2$ or $TiSi_2$. The unreacted metal is then removed from the wafer surface, leaving the metal silicide over the source/drain regions and over the gate interconnect regions. Exceeding etch process tolerances at the contact etch step will result in the erosion of silicide layers (such as $TiSi_2$, etc.). Photoresist masking and lithographic process variations in a manufacturing environment may prevent consistent definition of small contact areas required by small geometry, conventionally designed MOS transistors. Exceeding masking layer to layer alignment tolerances will result in etch erosion of the field oxide boundary around each transistor during plasma contact etch, ultimately resulting in transistor failure.

2. Description of the Related Art

In the article by D. C. Chen, et al., cited above as a related publication, a process is described that can achieve the same purpose, i.e. to provide a layer of material to protect a portion of the substrate against subsequent processing steps. The protective layer described in the reference is produced by the deposition of a layer of refractory metal and a layer of amorphous silicon. These two layers involve a procedure requiring a plurality of process steps. Furthermore, the deposition of the material layers are subject to strict controls to be successful. Finally, the described protective layer was useful only for a self-aligned silicide (salicide) process. These features minimize the usefulness of the protective layer described by Chen, et al.

A need has therefore been felt for a process that can provide a protective layer over a semiconductor junction in a silicon substrate that does not involve critical process control and which has a wide applicability to fabrication of semiconductor junctions.

FEATURES OF THE INVENTION

It is an object of the present invention to provide an improved technique for fabricating semiconductor junctions.

It is a feature of the present invention to provide an improved process for the placement of a metal contact plate over both a semiconductor junction and over the isolating field oxide boundary surrounding this junction, thereby protecting both regions during plasma etching of the contact opening in the dielectric layer.

It is still another feature of the present invention to provide an improved vertical metal layering at the metal contact plate which, when compared to conventional contact designs, reduces contact resistance, and decreases contact electromigration susceptibility.

It is yet another feature of the present invention to provide an improved horizontal metal contact plate layout design method which allows the use of the minimum geometry transistor design rules, but which reduces the critical dimension control at contact masking and plasma contact etch and also reduces the alignment tolerance requirement between the metal contact and the gate interconnect by aligning the contact opening to an underlying metal plate.

It is a still further feature of the present invention to provide a method for varying the design of the metal contact opening while maintaining minimum geometry transistor design rules.

SUMMARY OF THE INVENTION

The aforementioned and other features are obtained, according to the present invention, by first depositing a thin metal plate over the junction surface. By means of conventional photoresist mask, metal deposition and lift-off processes, a thin metal layer 100 nm to 300 nm in thickness is placed over the junction surface and extends over the boundary of the isolating field oxide surrounding the junction. (Hereafter this metal layer will be referred to as the metal plate or the contacting metal plate). After this metal plate is in place, a dielectric film is deposited over the device surface. By means of a photoresist mask, aligned with the underlying metal plate, and plasma etch processing, metal interconnect contact openings are etched through the dielectric film to the contacting metal plate. The contacting metal plate acts as an etch stop layer preventing erosion of the underlying layers. The metal interconnect contact layer deposited into the metal interconnect contact openings forms a low electrical resistance interface at the contacting metal plate surface. Because the contacting metal plate is oversized with respect to the metal interconnect contact opening, alignment becomes less critical. The contacting metal plate process sequence permits coupling of the contacting metal plate to silicided junction surfaces or bare junction surfaces, reducing the resistance between the junction surface and the metal interconnect contact layer. The contacting metal plate can be a diffusion barrier metal which increases the thermal stability of the contact resistance and decreases electromigration susceptibility. While maintaining minimum transistor design dimensions and critical alignment tolerances, the size of the contacting metal plate allows for the increase in the metal interconnect contact opening area.

These and other features of the present invention will be understood upon reading of the following description along with the drawings.

DESCRIPTION OF THE PREFERRED EMBODIMENT

Detailed Description of the Figures

Figure 1:
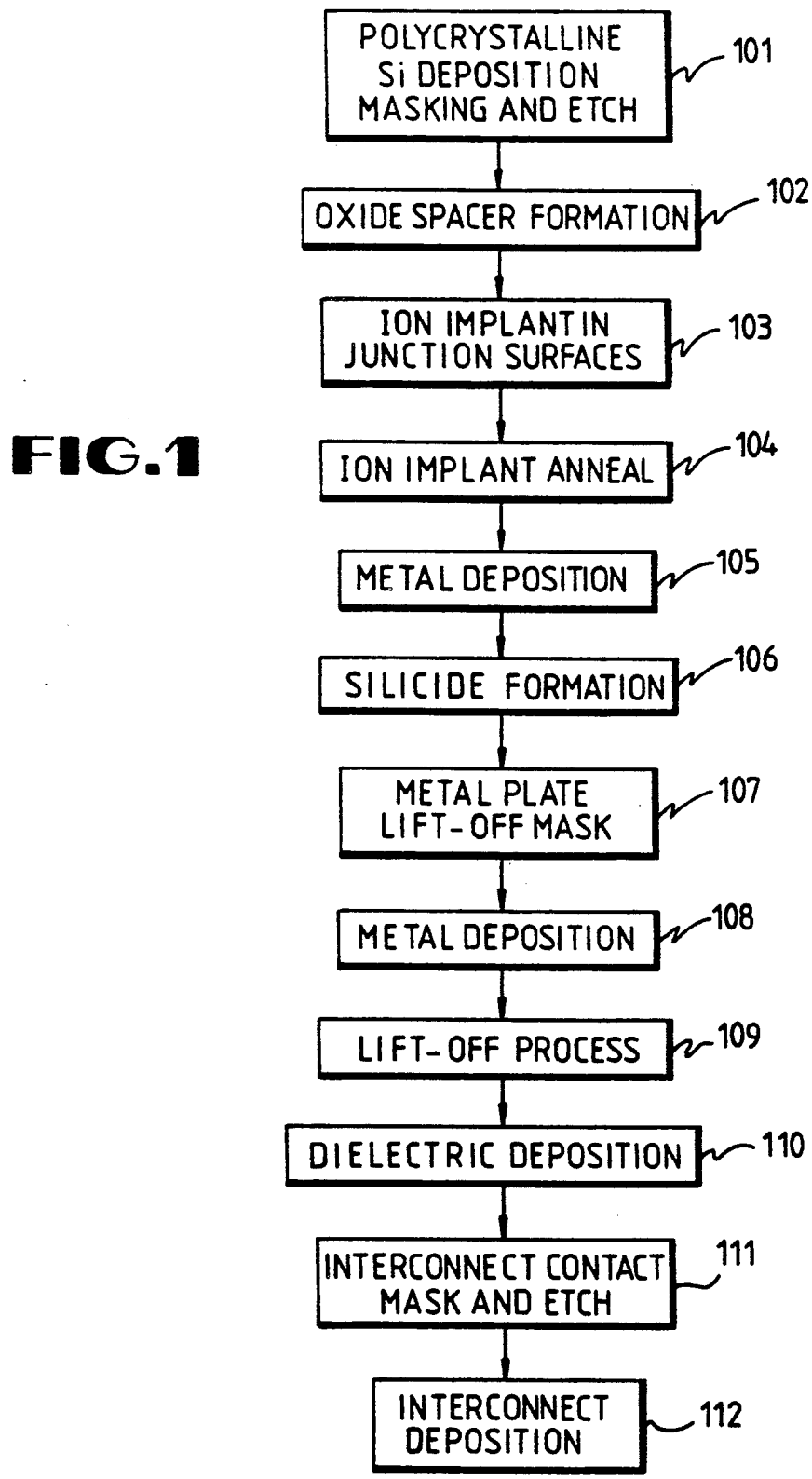
FIG. 1 is a process flow diagram for providing a contact metal plate for a self-aligned silicide (salicide) process where the gate interconnect is a silicide/poly-crystalline silicon region and a silicide layer covers the junction surface.

Referring first to FIG. 1, the process for providing a semiconductor-metal contact according to the present invention is illustrated. Step 101, the deposition of poly-crystalline silicon in conjunction with the masking and etching operations; step 102, the oxide spacer formation; step 103, the implantation of ions in the junction surfaces; step 104, the annealing of the ion implantation: step 105, the metal deposition; step 106, the silicide formation; and step 107, the metal plate lift-off mask are steps typically included in the formation of semiconductor devices. The innovative features of the invention begins with step 108, wherein a metal deposition is applied to the junction regions and can overlap field oxide regions. In step 109, a metal lift-off process removes the unincorporated metal from step 108. In step 110, a dielectric layer is applied to the portion of the processed substrate containing the junction region. An interconnect contact mask is formed on the dielectric material and an aperture in the dielectric material, defined by the interconnect contact mask, is etched away. In step 112, a deposition of interconnection metal is applied to the aperture in the dielectric material, forming an electrical contact with the metal layer of step 108 and, consequently the underlying junction region.

Figure 2A:
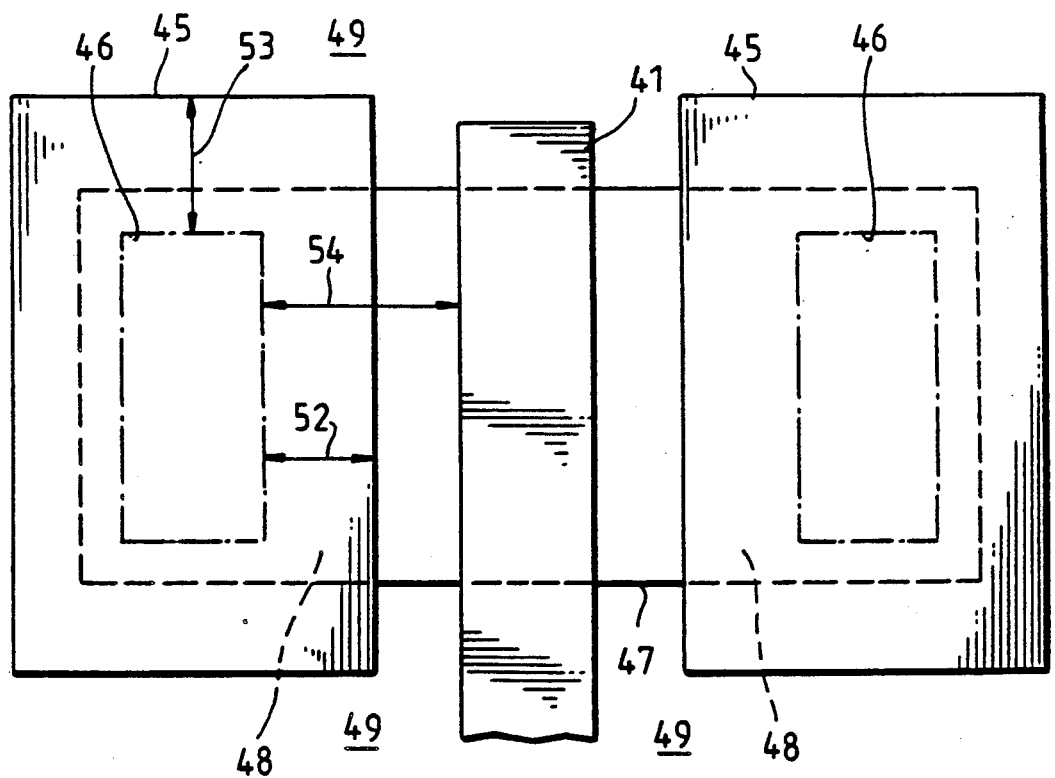
FIG. 2A is a planar view of an MOS transistor illustrating the advantages of the contacting metal plate design.
Figure 2B:
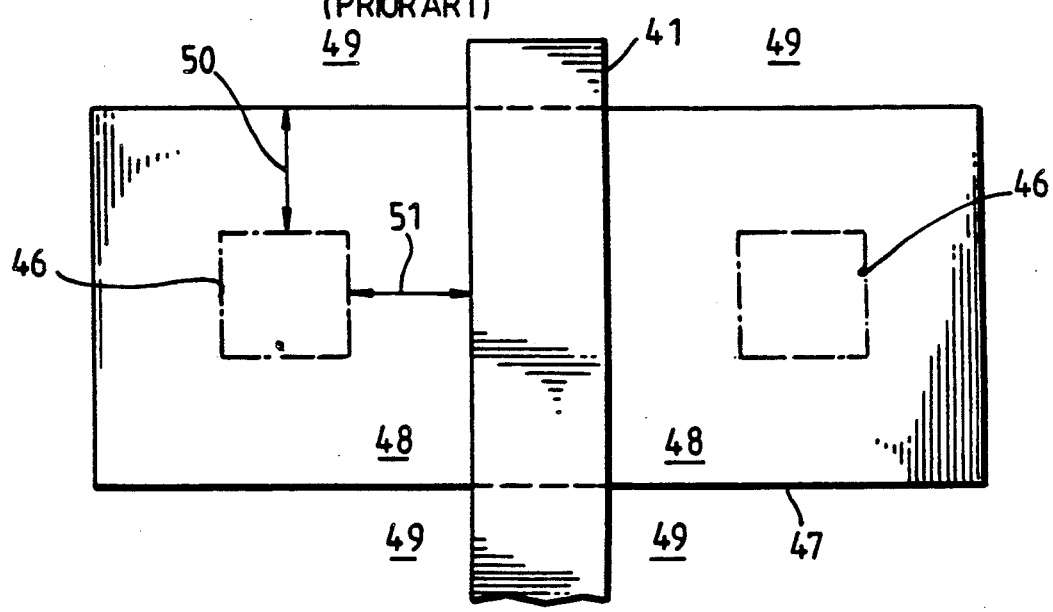
FIG. 2B is a planar view of an MOS transistor designed with conventional design rules.

Referring to FIG. 2A and FIG. 2B, a top view of a metal interconnect to a semiconductor junction region 48 is shown for the present invention and for the related art, respectively. The field oxide regions 49 are separated from the junction regions 48 by boundary 47. Apertures 46 in the dielectric material (not shown) permit the interconnect metal to contact the contacting metal plates 45 in FIG. 2A and contact the junction region 48. The gate interconnect region 41 is separated from the apertures 46 by dimension 54. Dimension 50 is the distance from the aperture to the field oxide region 49 in the related art while dimensions 53 and 52 are the distances from the apertures 46 to the boundary of contacting metal plate 45.

Figure 3:
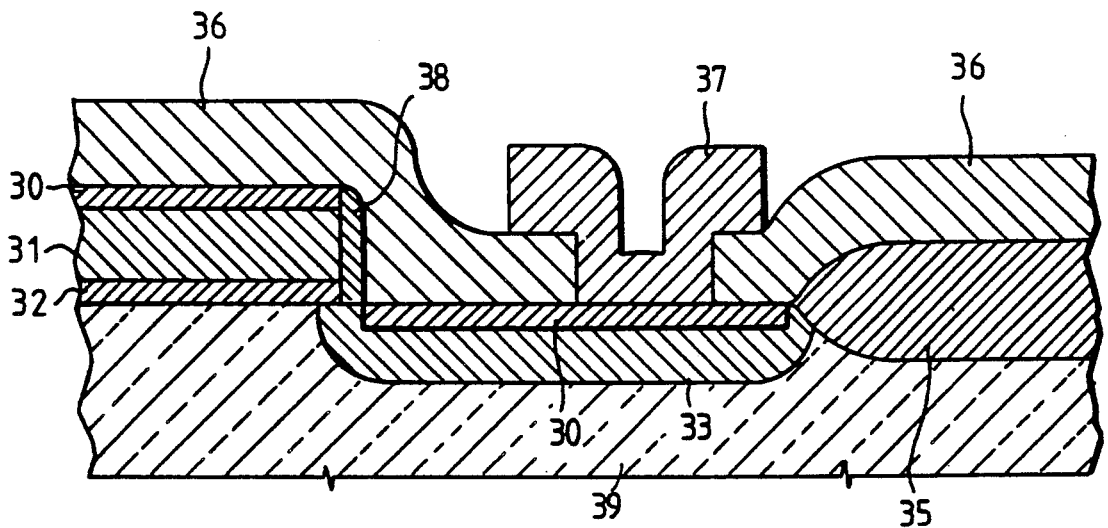
FIG. 3 is the cross section of an MOS transistor designed with conventional design rules, showing ideal contact opening alignment and ideal plasma contact etching.
Figure 4:
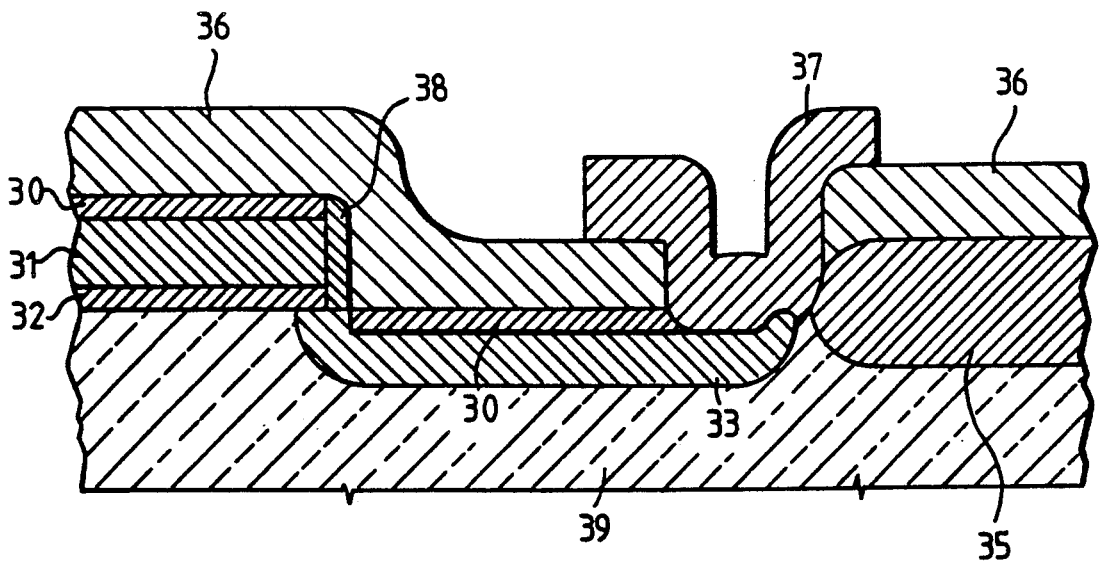
FIG. 4 is the cross section of an MOS transistor designed with conventional design rules, showing contact opening misalignment and contact over-etching with erosion of the field oxide and the silicide layer.
Figure 5:
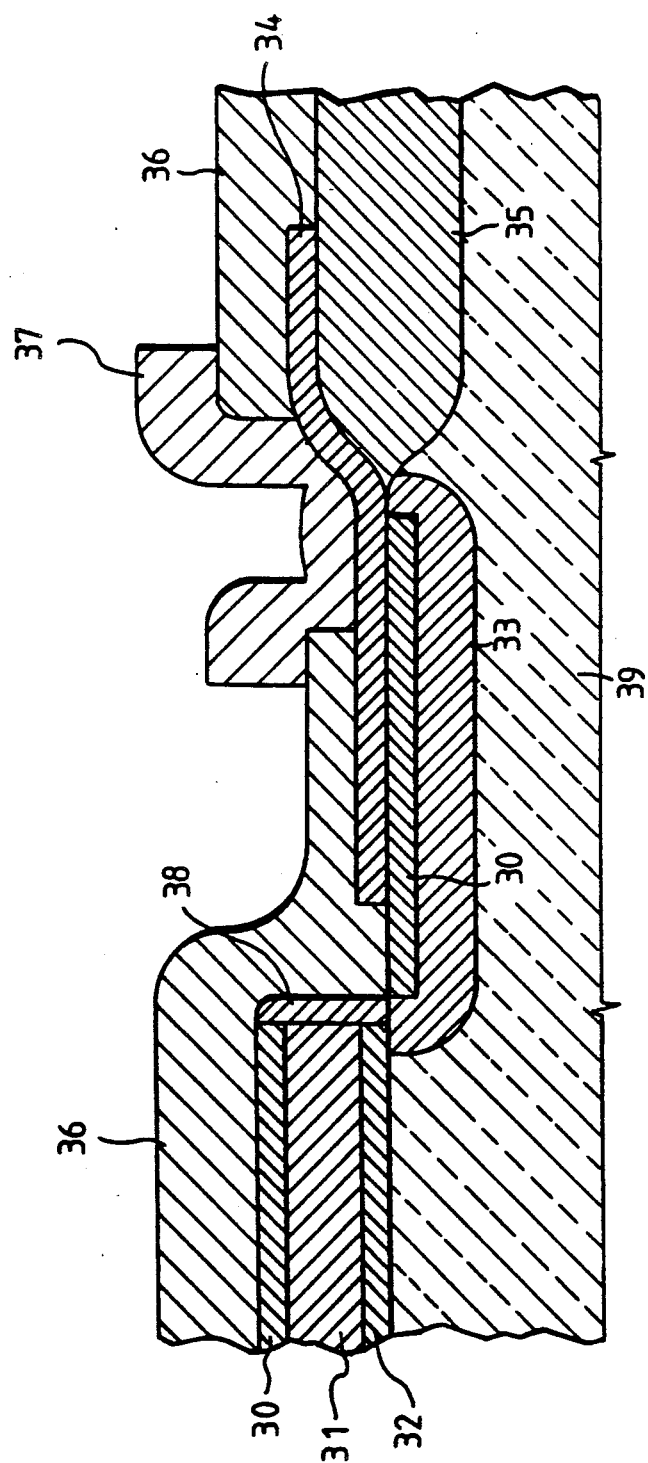
FIG. 5 is the cross section of an MOS transistor designed with contact metal plate design rules, showing contact opening alignment to the metal plate and etch-stop capability of the metal plate.

Referring next to FIG. 3, FIG. 4 and FIG. 5, cross-sectional views of the relationship of the related art (FIG. 3 and FIG. 4) to the present invention (FIG. 5) ar shown. Region 39 is the semiconductor region in which the transistors are formed. The region 33 is the junction region, while region 30 is a silicide layer (c.f. step 106). Region 31 is a poly-crystalline gate interconnect (c.f. step 101), while region 38 is an oxide spacer region (c.f. step 102). Region 35 is a field oxide region, region 22 is a gate oxide region, region 36 is a dielectric layer and region 37 is a metal interconnect layer. In FIG. 5, region 34 is a contacting metal plate of the present invention.

Operation of the Preferred Embodiment

The advantages of the preferred embodiment of this invention are illustrated in the contact design scheme shown in FIG. 2A as compared to the conventional design scheme of FIG. 2B. FIG. 2A illustrates the interconnect contact design of the present invention in this top view of a semiconductor device in which the contact metal plate 45 is placed over the junction (source/drain) regions 48 of a MOS transistor and extends over the field oxide region 49. Boundary 47 is the boundary between the junction regions 48 and the field oxide region 49. Region 41 is the gate interconnect region. Because the contacting metal plate 45 extends outside the junction region 48, the metal interconnect contact opening 46 in the dielectric layer overlying the contacting metal plate 45 can be made larger while maintaining minimum transistor design rules and allowed alignment tolerance limits. The critical alignment distances 52 and 53 extend to the edge of the metal plate. As the metal plate 45 dimensions are increased the alignment distances 52, 53 and the contact opening 46 dimensions can be increased and are not constrained by minimum transistor design rules. Conventional transistor design (FIG. 2B) illustrates that the metal interconnect contact opening 46 is constrained at a maximum area and is located inside the junction with critical alignment distances 50 and 51. The dimensions of metal interconnect contact opening 46 and critical dimensions 50 and 51 are dependent upon minimum transistor design rules.

Because the contacting metal plate 45 is oversized with respect to the junction area and with respect to the overlying interconnect contact mask, the alignment tolerance required to align the contact mask, which in this invention is aligned to the contacting metal plate rather than to the smaller junction area, is increased. Referring to FIGS. 2A and 2B, by virtue of the layout design when using the contacting metal plate 45, the gate interconnect region 41 to contact edge distance 54 has been increased and the contact edge to surrounding field oxide edge spacing 50 requirement has been eliminated. The contact dimension can be made larger as the metal plate area is increased. Minimum transistor dimensions and minimum spacing between transistors are obtainable without enhancements to lithography or etch process.

The preferred embodiment of this invention is described in the process flow illustrated in FIG. 1. The process flow for applying the contacting metal plate of the present invention to a salicide process with a silicide/poly-crystalline silicon gate interconnect and a silicided junction is illustrated. The contacting metal plate is formed after the silicide layer is formed over the junction surface in step 106 and before deposition of the dielectric in step 110 which electrically isolates the gate interconnect from the metal interconnect layer. The junction and silicide formation of the related art is shown in steps 101 through 107. A thin metal film is deposited, in step 108, from a directional metal source into the openings of a patterned photoresist mask having re-entrant or overhanging sidewalls conventionally used for a lift-off process as provided by step 107. The pattern opening in the mask enclosed the junction area and the isolating field oxide boundary around the junction. Referring to FIG. 5, after metal deposition and lift-off of the photoresist mask, a contacting metal plate 34, having a thickness of 100 nm to 300 nm, covers the silicide layer over junction 33, and the surrounding field oxide edge 35 but does not contact the transistor gate interconnect 30 and 31. Note that in FIG. 5 the junction 33 is covered with a silicide surface layer 30, the poly-crystalline silicon gate interconnet 31 is covered with a silicide layer 30 and layer 38 is the oxide spacer.

After the contacting metal plate is in place, a dielectric film 36 is deposited over the entire device surface by any conventional method. The metal interconnect contact photoresist mask, aligned to the contact metal plate 34, is applied and processed using conventional methods. The dielectric in the contact mask openings is plasma etched down the contacting metal plate 34. This layer acts as an etch stopping layer and prevents erosion of the silicide layer 30 formed over the junction, and prevents erosion of the underlying field oxide 35. This feature of the invention is illustrated by comparing FIGS. 3, 4 and 5. In order to achieve the ideal contact to a junction covered by a silicide layer 30 (such as $TiSi_2$, illustrated in FIG. 3), the contact opening in the dielectric layer 36, which extends down to the silicide layer 30, must not overlap the field oxide region 35 or the gate interconnect 30 and 31. FIG. 4 illustrates the case where both the contact mask alignment and the contact etching tolerances were exceeded. Erosion of the field oxide 35 and the silicide layer 30 has occurred and the metal interconnect 37 now forms an electrical shorting path across the junction 33 and substrate 39.

For a technology which uses the contacting metal plate as the primary metal contact between the unction and the metal interconnect, the contact resistance will be reduced as compared to conventional contacting schemes because of the increased area of contact afforded by the contacting metal plate. For a technology which forms a self-aligned silicide layer over the junction surface, the contacting metal plate should be a diffusion barrier material such as Ti-W, W or TiN, which will enhance the thermal stability of the contact resistance of the junction/silicide interface and the silicide/contacting metal plate interface. Also the diffusion barrier metal will decrease electromigration susceptibility and failure at the silicide/junction interface.

This process has wide application because it is compatible with poly-crystalline silicon, polycide and salicide gate interconnects and with non-silicided an silicided junction surfaces.

It will be clear to those skilled in the art that the contacting metal plate of the present invention can be used to form a local interconnect to contact adjacent transistors.

The foregoing description is included to illustrate the operation of the preferred embodiment and is not meant to limit the scope of the invention. The scope of the invention is to be limited only by the following claims. From the foregoing description, many variations will be apparent to those skilled in the art that would yet be encompassed by the spirit and scope of the invention.

What is claimed is:

1. A method of providing an electrical contact to a semiconductor junction region having a gate region associated therewith, said method comprising the steps of:
    implanting impurity ions in said semiconductor junction region to form a doped semiconductor junction region;
    applying a first mask to said semiconductor region, said first mask protecting said gate region, said first mask exposing a portion of said semiconductor junction region and adjoining field oxide region;
    depositing a contacting metal plate on said first mask and on said semiconductor junction region not protected by said first mask;
    removing said first mask and contacting metal plate deposited thereon;
    depositing a dielectric film on said contacting metal plate;
    applying a second mask to said semiconductor junction region, said mask exposing a region of dielectric film proximate said contacting metal plate, wherein alignment of said second mask is determined by dimensions of said contacting metal plate;
    etching an aperture in said region of dielectric film to expose said contacting metal plate, a portion of said aperture being above said junction region;
    removing said second mask; and
    applying a conducting layer suitable as said contact on said dielectric film and in said aperture on said contacting metal plate.

2. The method of providing an electrical contact of claim 1 further comprising the step of applying a silicide region over said junction region, wherein said applying a first mask step includes a step of exposing a portion of said silicide region.

3. The method of providing an electrical contact of claim 2 further comprising a step of determining alignment tolerances for said aperture based on dimensions of said metal contacting plate.

4. The method of providing an electrical contact of claim 1 wherein said etching step includes the step of etching said aperture such that said aperture exposes only said contacting metal plate.

5. The method of providing an electrical contact of claim 1 further comprising a step of controlling a depth of said etching with said contacting metal plate, wherein said aperture extends beyond an edge of said junction.

6. The method of providing an electrical contact to a junction region of a semiconductor element; said semiconductor element having at least a gate interconnect region, a field oxide region and a junction region, said method comprising the steps of:
    implanting preselected impurity ions in said junction region;
    applying a first mask to said semiconductor element;
    depositing a contacting metal plate on said first mask and to at least a portion of said junction region and said field oxide region exposed by said first mask, wherein said junction region does not have an insulating layer formed thereon;
    removing said first mask and contacting metal plate deposited thereon;
    applying a dielectric layer over said semiconductor element;
    applying a second mask to said dielectric layer, wherein alignment of said second mask is determined by dimensions f said contacting metal plate on said semiconductor element;

etching an aperture through said dielectric layer to said contacting metal plate in a region determined by said second mask such that a portion of said aperture is above said junction region; and depositing a metal layer in said aperture and on said dielectric surface to form said electrical contact.

7. The method of providing an electrical contact of claim 6 further comprising the step of forming a silicide layer on a surface of said junction region, wherein said depositing a contacting metal plate step includes a step of depositing said contacting metal plate on at least a portion of said silicide layer covering said junction region.

8. The method of providing an electrical contact of claim 7 wherein said step of covering said junction region includes a step of forming said silicide surface layer using a material selected from the group consisting of $CoSi_2$ and $TiSi_2$.

9. The method of providing an electrical contact of claim 8 wherein said step of depositing a contacting metal plate includes a step of forming said contacting metal plate with a dimension between 100 nm to 300 nm thick, said step of applying a second mask including the step of providing an aperture in said mask extending beyond an edge of said junction region.

10. The method of providing an electrical contact of claim 9 further including a step of preventing etching of an intermediate region between said junction region and said field oxide region by means of said contacting plate deposited on said intermediate region.

11. A method of providing an electrical coupling to a junction region of semiconductor element within minimum semiconductor design rules; wherein said semiconductor element includes at least a junction region, a gate interconnect region proximate said junction region, and a field oxide region proximate said junction region, said junction region being too small to permit an aperture to be etched thereto with said minimum semiconductor design rules; said junction region having preselected impurity ions implanted therein, said method comprising the steps of:

applying a first mask to said semiconductor element, said first mask including an aperture consistent with said minimum design rules exposing at least a portion of said junction region and a portion of said field oxide region;

depositing a metal material on said semiconductor element and mask;

removing said mask leaving a contacting metal plate comprised of said metal material on said exposed portion of said junction region and said exposed portion of said field oxide region;

depositing a dielectric layer on said semiconductor element and said contacting metal plate;

applying a second mask, said second mask including a second aperture proximate said contacting metal plate consistent with said minimum semiconductor design rules, a portion of said second aperture being above said junction region said second mask including at least one path aperture;

etching through said dielectric layer to said contacting metal in a vicinity of said second aperture; and depositing an interconnect metal layer on said semiconductor element, said interconnect metal layer coupling said contacting metal layer with an interconnect metal layer path determined by said at least one path aperture.

12. The method of claim 11 further comprising a step of converting a surface of said junction region to a silicide region surface layer prior to applying said first mask.

13. The method of claim 11 further comprising a step of using a diffusion barrier material to form said contacting metal plate.

14. The method of claim 11 further comprising the step of forming said second aperture in said second mask with dimensions extending beyond an edge of said junction region.

15. The method of claim 11 further comprising the step of removing said second mask, said interconnect metal path being electrically coupled to said junction region.

* * * * *

UNITED STATES PATENT AND TRADEMARK OFFICE
CERTIFICATE OF CORRECTION

PATENT NO. : 5,094,980

DATED : March 10, 1992

INVENTOR(S) : Adam Shepela

It is certified that error appears in the above-identified patent and that said Letters Patent is hereby corrected as shown below:

Col. 1, line 21, please delete "metal" and insert therefor -- contact --.

DESCRIPTION OF THE PREFERRED EMBODIMENT:

Col. 4, line 6, please delete "22" and insert therefor -- 32 --.

Col. 5, line 16, please delete "interconnet" and insert therefor

-- interconnect --.

Col. 5, line 40, please delete "unction" and insert therefor

-- junction --.

IN THE CLAIMS:

Col. 7, line 1, please delete "f" and insert therefor -- of --.

Col. 7, line 41, please delete "afield" and insert therefor

-- a field --.

Signed and Sealed this

Seventeenth Day of August, 1993

*Attest:*

BRUCE LEHMAN

*Attesting Officer*   *Commissioner of Patents and Trademarks*